United States Patent
Gogolla et al.

(10) Patent No.: US 11,156,673 B2
(45) Date of Patent: Oct. 26, 2021

(54) DEVICE AND METHOD FOR DETECTING ELECTRICALLY CONDUCTING OBJECTS TO BE MEASURED IN A GROUND

(71) Applicant: Hilti Aktiengesellschaft, Schaan (LI)

(72) Inventors: Torsten Gogolla, Schaan (LI); Dietmar Schoenbeck, Goefis (AT); Geert Kalusche, Grabs (CH); Christoph Wuersch, Werdenberg (CH)

(73) Assignee: Hilti Aktiengesellschaft, Schaan (LI)

( * ) Notice: Subject to any disclaimer, the term of this patent is extended or adjusted under 35 U.S.C. 154(b) by 16 days.

(21) Appl. No.: 16/592,905

(22) PCT Filed: Mar. 26, 2018

(86) PCT No.: PCT/EP2018/057576
§ 371 (c)(1),
(2) Date: Oct. 4, 2019

(87) PCT Pub. No.: WO2018/184880
PCT Pub. Date: Oct. 11, 2018

(65) Prior Publication Data
US 2020/0166584 A1    May 28, 2020

(30) Foreign Application Priority Data

Apr. 5, 2017 (EP) .................... 17165035

(51) Int. Cl.
*G01R 33/00* (2006.01)
*G01V 3/10* (2006.01)
*G01V 3/165* (2006.01)

(52) U.S. Cl.
CPC ..... *G01R 33/0047* (2013.01); *G01R 33/0076* (2013.01); *G01V 3/108* (2013.01); *G01V 3/165* (2013.01)

(58) Field of Classification Search
CPC ............ G01R 33/0047; G01R 33/0076; G01V 3/108; G01V 3/165; G01V 3/105; G01V 3/08
(Continued)

(56) References Cited

U.S. PATENT DOCUMENTS 4,433,528 A * 2/1984 Bohman ................. G01V 3/08
340/684
4,531,118 A * 7/1985 Beams ................ A01D 75/187
340/684
(Continued)

FOREIGN PATENT DOCUMENTS

DE         4424058 C1    10/1995
DE    102013209805 A1    11/2014

OTHER PUBLICATIONS

International Search Report of PCT/EP2018/057576, dated May 28, 2018.

*Primary Examiner* — Christopher P McAndrew
(74) *Attorney, Agent, or Firm* — Davidson, Davidson & Kappel, LLC

(57) ABSTRACT

A device (10) for detecting electrically conducting objects to be measured in a ground is provided, including a housing (21), a solenoid unit (34) situated in the housing (21), which includes a transmitter coil unit (38) and a receiver coil unit (39), a control unit (36), and an evaluation unit (37). A metal sheet (35) is provided in the housing (21), the solenoid unit (34) being situated on a lower side (53) of the metal sheet (35) facing the ground during the measuring operation, and the control unit (36) being situated on an upper side (54) of the metal sheet (35) facing away from the ground during the measuring operation.

20 Claims, 6 Drawing Sheets

(58) Field of Classification Search
USPC .......................................................... 324/329
See application file for complete search history.

(56) References Cited

U.S. PATENT DOCUMENTS

| | | | | |
|---|---|---|---|---|
| 4,853,617 | A * | 8/1989 | Douglas | G01V 3/08 324/67 |
| 4,868,504 | A * | 9/1989 | Johnson | G01V 3/104 324/329 |
| 4,945,305 | A * | 7/1990 | Blood | G01B 7/14 324/207.17 |
| 4,992,741 | A | 2/1991 | Douglas et al. | |
| 5,121,105 | A * | 6/1992 | Aittoniemi | G01V 3/105 340/551 |
| 5,767,679 | A * | 6/1998 | Schroder | G01V 3/12 324/337 |
| 5,896,031 | A * | 4/1999 | King | G01V 3/107 324/225 |
| 6,084,412 | A * | 7/2000 | Guo | G01V 3/15 324/239 |
| 6,104,193 | A * | 8/2000 | Bell | G01V 3/15 324/329 |
| 6,541,966 | B1 | 4/2003 | Keene et al. | |
| 6,967,574 | B1 * | 11/2005 | Nelson | F41H 11/136 324/228 |
| 7,265,551 | B2 * | 9/2007 | Kellermann | G01V 3/15 324/326 |
| 7,281,432 | B2 * | 10/2007 | Omata | G01D 5/2046 73/800 |
| 9,018,935 | B2 * | 4/2015 | McAdam | G01V 3/104 324/67 |
| 9,651,341 | B2 * | 5/2017 | Nelson | F41H 11/136 |
| 2002/0030492 | A1 * | 3/2002 | Guo | G01V 3/12 324/334 |
| 2003/0052684 | A1 * | 3/2003 | Nelson | G01V 3/105 324/329 |
| 2011/0210034 | A1 * | 9/2011 | Shibata | B32B 27/34 206/524.6 |
| 2014/0218036 | A1 * | 8/2014 | Fry | G01V 3/165 324/329 |
| 2014/0285203 | A1 * | 9/2014 | Olsson | G01V 3/15 324/326 |
| 2015/0204995 | A1 * | 7/2015 | Olsson | G01S 19/13 324/329 |
| 2017/0017010 | A1 * | 1/2017 | Olsson | G01V 3/02 |
| 2020/0166584 | A1 * | 5/2020 | Gogolla | G01V 3/108 |

* cited by examiner

DEVICE AND METHOD FOR DETECTING ELECTRICALLY CONDUCTING OBJECTS TO BE MEASURED IN A GROUND

The present invention relates to a device for detecting electrically conducting objects to be measured in a ground, and to a method for detecting electrically conducting objects to be measured in a ground.

BACKGROUND

The company Proceq SA distributes a device for detecting metallic objects to be measured in a ground under the product name "Profometer." The device includes a housing, a solenoid unit having a transmitter coil unit which includes at least one transmitter coil, and a receiver coil unit, which includes at least one receiver coil, a control unit, and an evaluation unit. The control unit is connected to the solenoid unit and designed to control the transmitter and receiver coil units. The evaluation unit is connected to the solenoid unit and designed to evaluate a voltage induced in at least one receiver coil of the receiver coil unit.

The PM-6 Profometer operates with a measuring method which utilizes electromagnetic pulses for detecting reinforcing bars. Current pulses are transmitted periodically through multiple transmitter coils, so that the transmitter coils build up a magnetic field. Electrical currents (eddy currents) are induced by induction in electrically conducting materials present in the magnetic field, which in turn generate a secondary magnetic field. The secondary magnetic field generates measuring signals in the receiver coils of the solenoid unit, which are evaluated by the evaluation unit. It is pointed out in the operating manual of the PM-6 Profometer that electrically non-conducting materials, such as concrete, wood, plastic or brick, which are present within the magnetic field, do not affect the measuring results. If, in contrast, electrically conducting materials are present within the magnetic field, influences on the measuring results of the PM-6 Profometer are to be expected.

The solenoid unit is situated in a separate measuring probe in the PM-6 Profometer and is thus spatially separated from the control unit, the evaluation unit and a display unit. As a result of the spatial separation of the solenoid unit, the influence on the measuring results by electrically conducting materials may be reduced. The disadvantage is that the measuring results of the PM-6 Profometer may be influenced by electrically conducting foreign objects, such as watches or rings worn by the operator. The operator grabs the measuring probe using his or her hand, so that a watch or a ring is situated a short distance from the solenoid unit and is able to heavily influence the measuring results.

SUMMARY OF THE INVENTION

It is an object of the present invention to further develop a device and a method for detecting electrically conducting objects to be measured in a ground to the effect that the influence of electrically conducting foreign and interfering objects on the measuring results is reduced. Moreover, it is to be possible to situate all device components of the device in a housing.

The present invention provides a device for detecting electrically conducting objects to be measured in a ground, and a method for detecting electrically conducting objects to be measured in a ground.

The device for detecting electrically conducting objects to be measured in a ground is characterized in that a metal sheet having a sheet metal thickness d is provided in the housing, the metal sheet being essentially situated in parallel to the surface of the ground during the measuring operation, the solenoid unit being situated on a lower side of the metal sheet facing the ground during the measuring operation, and the control unit being situated on an upper side of the metal sheet facing away from the ground during the measuring operation. It is the idea of the present invention to reduce the influence of electrically conducting foreign objects and electrically conducting interfering objects on the measuring results by a metal sheet. The metal sheet spatially separates the solenoid unit, which during the measuring operation is situated on the lower side of the metal sheet, from the control unit, which during the measuring operation is situated on the upper side of the metal sheet. The lower side denotes the side of the metal sheet facing the ground to be detected, and the upper side denotes the side of the metal sheet facing away from the ground to be detected.

The device according to the present invention for detecting electrically conducting objects to be measured includes a solenoid unit, which includes a transmitter coil unit and a receiver coil unit, a control unit, which is connected to the solenoid unit and designed to control the solenoid unit, and an evaluation unit, which is connected to the solenoid unit and designed to evaluate a voltage induced in the receiver coil unit. The term "control unit" covers all components for controlling the solenoid unit, such as the power source and the switching transistor, and the term "evaluation unit" covers all components for signal and measured value processing, such as the amplifier, the filter or the analog-to-digital converter. The control unit and the evaluation unit include electronic components attached to a circuit board, it being possible for the control and evaluation units to be situated on a shared circuit board or on different circuit boards. A circuit board is made up of electrically insulating material including conducting connections (strip conductors) and is used to mechanically attach and to electrically connect the electronic components. Both the strip conductors, which are made of copper, and the electronic components include a number of electrically conducting materials in which eddy currents are generated and which influence the measuring results.

The present invention distinguishes between the terms "electrically conducting objects to be measured," "electrically conducting foreign objects," and "electrically conducting interfering objects." The term "electrically conducting objects to be measured" covers all objects which are embedded in the ground to be examined and which are to be detected by the device according to the present invention. "Electrically conducting foreign objects" are all objects which are situated outside the ground to be examined and outside the housing of the device according to the present invention. The term "electrically conducting interfering objects" covers all objects which are situated inside the housing of the device according to the present invention or attached to the housing of the device according to the present invention. Objects are referred to as electrically conducting objects when the electrical conductivity is greater than $10^6$ S/m.

During the measuring operation of the device according to the present invention, a current I flows through the transmitter coils of the transmitter coil unit, and the transmitter coils generate a primary magnetic field. Current I is switched off by the control unit at a switch-off point in time $t_0$, and the primary magnetic field of the transmitter coil unit decays. When current I is switched on and off, the changing primary magnetic field of the transmitter coil unit creates eddy currents in electrically conducting foreign and interfering objects, which generate secondary magnetic fields. The metal sheet itself represents an electrically conducting interfering object in this process. The primary magnetic field of the transmitter coil unit and the secondary magnetic fields created by the eddy currents are superimposed to form a resulting magnetic field. After current I is switched off in the transmitter coil unit, the measuring signals are recorded in the receiver coil unit. When current I is switched off, eddy currents are created in electrically conducting foreign and interfering objects on the upper side of the metal sheet, whose secondary magnetic fields are oriented in the same direction as the primary magnetic field of the transmitter coil unit. The secondary magnetic fields, in turn, generate eddy currents in the metal sheet, whose magnetic fields are oriented in a direction opposite the secondary magnetic fields and weaken the resulting magnetic field.

The weaker the resulting magnetic field above the solenoid unit, the lower is the influence of electrically conducting foreign and interfering objects on the measuring results of the device according to the present invention. The resulting magnetic field on the lower side of the metal sheet induces voltages in the receiver coils of the receiver coil unit which are recorded as measuring signals and evaluated by the evaluation unit. Via the material selection and the sheet metal thickness of the metal sheet, it is possible to influence the resulting magnetic field acting on electrically conducting foreign and interfering objects on the upper side of the metal sheet. The action of the metal sheet is dependent on the electrical conductivity and the magnetic permeability of the used metallic material, and additionally the sheet metal thickness influences the action of the metal sheet.

In a preferred embodiment, the evaluation unit includes a first evaluation unit, which processes the measuring signals of the receiver coil unit, and a second evaluation unit, which evaluates the processed measuring signals, the first evaluation unit being situated on the upper side of the metal sheet facing away from the ground during the measuring operation. The first evaluation unit is connected to the receiver coil unit and processes the measuring signals. This includes an amplifier, a filter or an analog-to-digital converter. The first evaluation unit represents an electrically conducting interfering object, which negatively influences the measuring results of the device. By situating the first evaluation unit on the upper side of the metal sheet, the negative influence on the measuring results is reduced.

In a first particularly preferred variant, the second evaluation unit is situated on the upper side of the metal sheet facing away from the ground during the measuring operation. The second evaluation unit is connected to the first evaluation unit and evaluates the processed measuring signals. The second evaluation unit represents an electrically conducting interfering object, which negatively influences the measuring results of the device. By situating the second evaluation unit on the upper side of the metal sheet, the negative influence on the measuring results is reduced. Situating the second evaluation unit in the housing moreover allows the design of a one-piece device, in which all device components may be situated in the housing.

In a second particularly preferred variant, the second evaluation unit is situated outside the housing, the first and second evaluation units being connectable via a communication link. The first evaluation unit processes the measuring signals, the processed measuring signals are transmitted via the communication link to the second evaluation unit, and the second evaluation unit evaluates the processed measuring signals. The communication link may be designed as a wireless or wired communication link. The second variant lends itself when the device has a two-piece design. Device components which may be situated outside the housing reduce the weight and allow the design of a compact housing, which is moved over the ground to be detected.

The housing preferably encloses an interior, and the metal sheet divides the interior into a lower portion and an upper portion, the solenoid unit being situated in the lower portion of the interior, and the control unit and the first evaluation unit being situated in the upper portion of the interior. The metal sheet separates the solenoid unit, which is situated in the lower portion, from the control unit and the evaluation unit, which are situated in the upper portion. During the measuring operation of the device, eddy currents generate secondary magnetic fields in the metal sheet which reduce the influence of electrically conducting foreign and interfering objects on the measuring results of the device according to the present invention. By situating the control unit and the first evaluation unit in the upper portion of the housing, their influence on the measuring results is reduced.

The device preferably includes a display unit including a display, which is designed for displaying a measuring result calculated by the second evaluation unit, the display being situated on the upper side of the metal sheet facing away from the ground during the measuring operation. The display unit including the display includes numerous electrically conducting materials which may negatively influence the measuring results of the device and is situated on the upper side of the metal sheet in the device according to the present invention. The display may be recessed in the housing or attached on the housing. The metal sheet enables the design of a one-piece device including a large display.

The device preferably includes a memory unit, which is connected to the second evaluation unit and in which a calibration signal is stored, the calibration signal having been ascertained in the absence of electrically conducting objects to be measured. The calibration signal is ascertained with the aid of the device according to the present invention in the absence of electrically conducting objects to be measured and is stored in the memory unit. The measuring method operates with a difference signal, which is formed as the difference between a measuring signal and the stored calibration signal. The use of the difference signal has the advantage that effects, such as secondary fields of electrically conducting interfering objects, are eliminated by the difference creation.

The action of the metal sheet is dependent, among other things, on electrical conductivity $\sigma$ of the used metal, magnetic permeability $\mu$ of the used metal, and sheet metal thickness d. Electrical conductivity $\sigma$ and magnetic permeability $\mu$ are established by the selection of a metal, sheet metal thickness d may be varied for an established metal. The term "metal" covers pure metals and metal alloys. Via the selection of the parameters electrical conductivity $\sigma$, magnetic permeability $\mu$ and sheet metal thickness d, it is possible to adapt the action of the metal sheet to the device according to the present invention. Aluminum and copper are particularly suitable metals for the metal sheet. The term "aluminum" covers pure aluminum and aluminum alloys, and the term "copper" covers pure copper and copper alloys.

In a first preferred embodiment, the metal sheet is made of aluminum, the metal sheet having a sheet metal thickness d of at least 1.0 mm. By selecting aluminum as the metal, the electrical conductivity and the magnetic permeability of the metal sheet, which is also referred to as an aluminum sheet, are established, and the compensating action of the metal sheet may be varied via the sheet metal thickness. When aluminum sheets are used, a sheet metal thickness of at least 1.0 mm is necessary. In the case of aluminum sheets having sheet metal thicknesses of at least 1.0 mm, the aluminum sheet ensures that the amplitudes of the received signals for time shifts Δt smaller than 10 μs after the shut-off point in time $t_0$ of the current are measurable by the evaluation unit. For the received signals to be measurable by the evaluation unit, the received signals must be below the overload limit of the evaluation unit.

Particularly preferably, the metal sheet (aluminum sheet) has a sheet metal thickness d of at least 2 mm. A sheet metal thickness of the aluminum sheet of at least 2.0 mm ensures that the amplitudes of the received signals for time shifts Δt greater than 5 μs after shut-off point in time to of the current are measurable by the evaluation unit.

In a second preferred embodiment, the metal sheet is made of copper, the metal sheet having a sheet metal thickness d of at least 0.4 mm. By selecting copper as the metal, the electrical conductivity and the magnetic permeability of the metal sheet, which is also referred to as a copper sheet, are established, and the compensating action of the metal sheet may be varied via the sheet metal thickness. When copper sheets are used, a sheet metal thickness of at least 0.4 mm is necessary. In the case of copper sheets having sheet metal thicknesses of at least 0.4 mm, the copper sheet ensures that the amplitudes of the received signals for time shifts Δt smaller than 10 μs after shut-off point in time $t_0$ of the current are measurable by the evaluation unit. For the received signals to be measurable by the evaluation unit, the received signals must be below the overload limit of the evaluation unit.

Particularly preferably, the metal sheet (copper sheet) has a sheet metal thickness d of at least 0.8 mm. A sheet metal thickness of the copper sheet of at least 0.8 mm ensures that the amplitudes of the received signals for time shifts Δt greater than 5 μs after shut-off point in time to of the current are measurable by the evaluation unit.

A method for detecting electrically conducting objects to be measured in a ground using the device according to the present invention, which includes a transmitter coil unit, a receiver coil unit, a control unit and an evaluation unit, includes a step sequence including the steps:
  having a current I flow through at least one transmitter coil of the transmitter coil unit;
  switching off current I by the control unit at a switch-off point in time $t_0$;
  recording a voltage, induced in at least one receiver coil of the receiver coil unit, by the evaluation unit with a time shift Δt after switch-off point in time $t_0$ of current I as a measuring signal; and
  determining a difference signal by the evaluation unit as a difference between the measuring signal and a stored calibration signal, the calibration signal having been ascertained in the absence of electrically conducting objects to be measured.

The method according to the present invention for detecting electrically conducting objects to be measured in a ground is carried out with the aid of the device according to the present invention. The transmitter coil unit includes one or multiple transmitter coil(s), and the receiver coil unit includes one or multiple receiver coil(s). A current I flows through at least one transmitter coil of the transmitter coil unit and is switched off by the control unit at a switch-off point in time $t_0$. The transmitter coils having current flow through them generate a primary magnetic field, which decays after current I is switched off. When current I is switched off, eddy currents are created in electrically conducting foreign and interfering objects on the upper side of the metal sheet, whose secondary magnetic fields are oriented in the same direction as the primary magnetic field of the transmitter coil unit. The secondary magnetic fields, in turn, generate eddy currents in the metal sheet, whose magnetic fields are oriented in a direction opposite the secondary magnetic fields and weaken the resulting magnetic field. The weaker the resulting magnetic field, the lower is the influence of electrically conducting foreign and interfering objects on the measuring results of the device according to the present invention.

The resulting magnetic field induces voltages in the receiver coils of the receiver coil unit. The induced voltages of the receiver coils are recorded by the evaluation unit as measuring signals. The method according to the present invention for detecting electrically conducting objects to be measured operates with a difference signal, which is formed as the difference between the measuring signal and a stored calibration signal. The calibration signal is ascertained with the aid of the device according to the present invention in the absence of electrically conducting objects to be measured and is stored, for example, in a memory unit.

The method according to the present invention for detecting electrically conducting objects to be measured utilizes a metal sheet to reduce the influence of electrically conducting foreign and interfering objects on the measuring results. However, the metal sheet itself forms an electrically conducting interfering object which influences the measuring results. Due to a time shift Δt with which the received signals are recorded by the evaluation unit after switch-off point in time $t_0$ of the current, the compensating action of the metal sheet may prevail. For this purpose, the properties of the metal sheet and the time shift Δt with which the received signals are recorded after switch-off point in time $t_0$ of the current must be matched to one another. The matching takes place via the selection of a suitable metal sheet (material and sheet metal thickness) and a suitable time shift Δt after switch-off point in time $t_0$ of the current in the transmitter coils of the transmitter coil unit.

Time shift Δt is preferably not smaller than 5 μs. Within the scope of the method according to the present invention, a measuring signal is recorded by the evaluation unit in at least one receiver coil of the receiver coil unit, the recording of the measuring signal taking place with time shift Δt after switch-off point in time $t_0$ of current I. Suitable values for time shift Δt are dependent, among other things, on the metallic material of the metal sheet and the sheet metal thickness of the metal sheet. The method according to the present invention utilizes the difference signal between the measuring signal and the calibration signal, which have a similar time curve. After the current is switched off, a rapid drop in the amplitudes of the received signals is observable, which is caused by the eddy currents penetrating from the surface into the interior of the electrically conducting objects. When the eddy currents flow completely through the electrically conducting objects, the rapid drop transitions into a slower drop of the received signals. The sheet metal thickness of the metal sheet is set in such a way that the transition from the rapid drop to the slower drop in the received signals (measuring and calibration signals) takes place with a time shift Δt greater than 5 μs, and the amplitudes of the received signals are below the overload limit during the transition. A sheet metal thickness of at least 1.0 mm is required for aluminum sheets, and a sheet metal thickness of at least 0.4 mm is required for copper sheets.

Time shift Δt is preferably not greater than 10 μs. With time shifts Δt smaller than or equal to 10 μs, it is ensured that the effects of the electrically conducting objects to be measured may be ascertained by the evaluation unit in the measuring signal. When time shifts Δt are too large, i.e., greater than 10 μs, the effects of the electrically conducting objects to be measured have already decayed too much in the measuring signal.

The sheet metal thickness of the metal sheet is set in such a way that the transition from the rapid drop to the slower drop in the received signals (measuring and calibration signals) takes place with time shifts Δt between 5 μs and 10 μs, and the amplitudes of the received signals are below the overload limit for these time shifts Δt.

BRIEF DESCRIPTION OF THE DRAWINGS

Exemplary embodiments of the present invention are described hereafter based on the drawings. They are not necessarily intended to represent the exemplary embodiments true to scale; rather, the drawings, where useful for explanation, is implemented in a schematic and/or slightly distorted form. It must be taken into consideration in this that a variety of modifications and changes regarding the shape and the detail of a specific embodiment may be carried out, without departing from the general idea of the present invention. The general idea of the present invention is not limited to the exact shape or the detail of the preferred specific embodiment shown and described hereafter, or limited to a subject matter which would be limited compared to the subject matter claimed in the claims. For given dimensional ranges, values within the described limits shall also be disclosed as limiting values and arbitrarily usable and claimable. For the sake of simplicity, identical reference numerals are used hereafter for identical or similar parts or parts having an identical or similar function.

DETAILED DESCRIPTION

Figure 1:
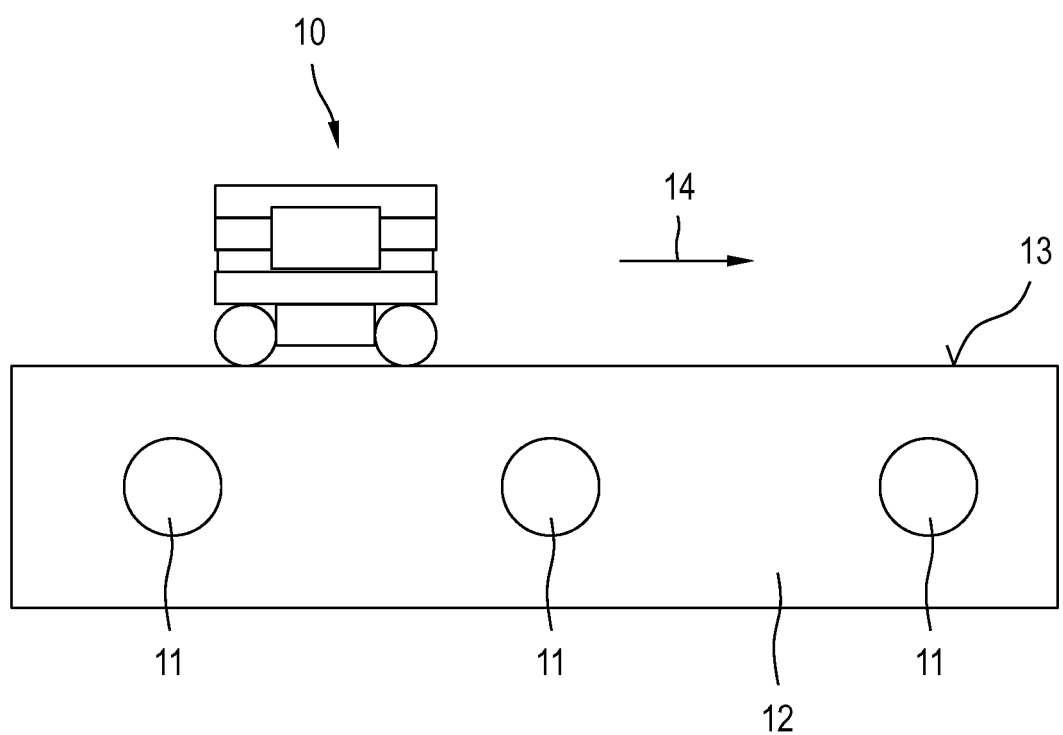
FIG. 1 shows the use of a device according to the present invention for detecting electrically conducting objects to be measured in a ground.

FIG. 1 shows the use of a device 10 according to the present invention for detecting electrically conducting objects to be measured 11 in a ground 12. Device 10 may be designed as a held or guided detection device. A held detection device is held without feed movement over a surface 13 of ground 12 to be detected, and a guided detection device is guided along a linear path or an arbitrary path over surface 13 of ground 12 to be detected. A detection device which is held or guided over surface 13 of ground 12 to be detected by an operator using his/her hand is referred to as being hand-held or hand-guided. FIG. 1 shows a hand-guided detection device 10, which is moved along a feed direction 14 over surface 13 of ground 12.

Figure 2A:
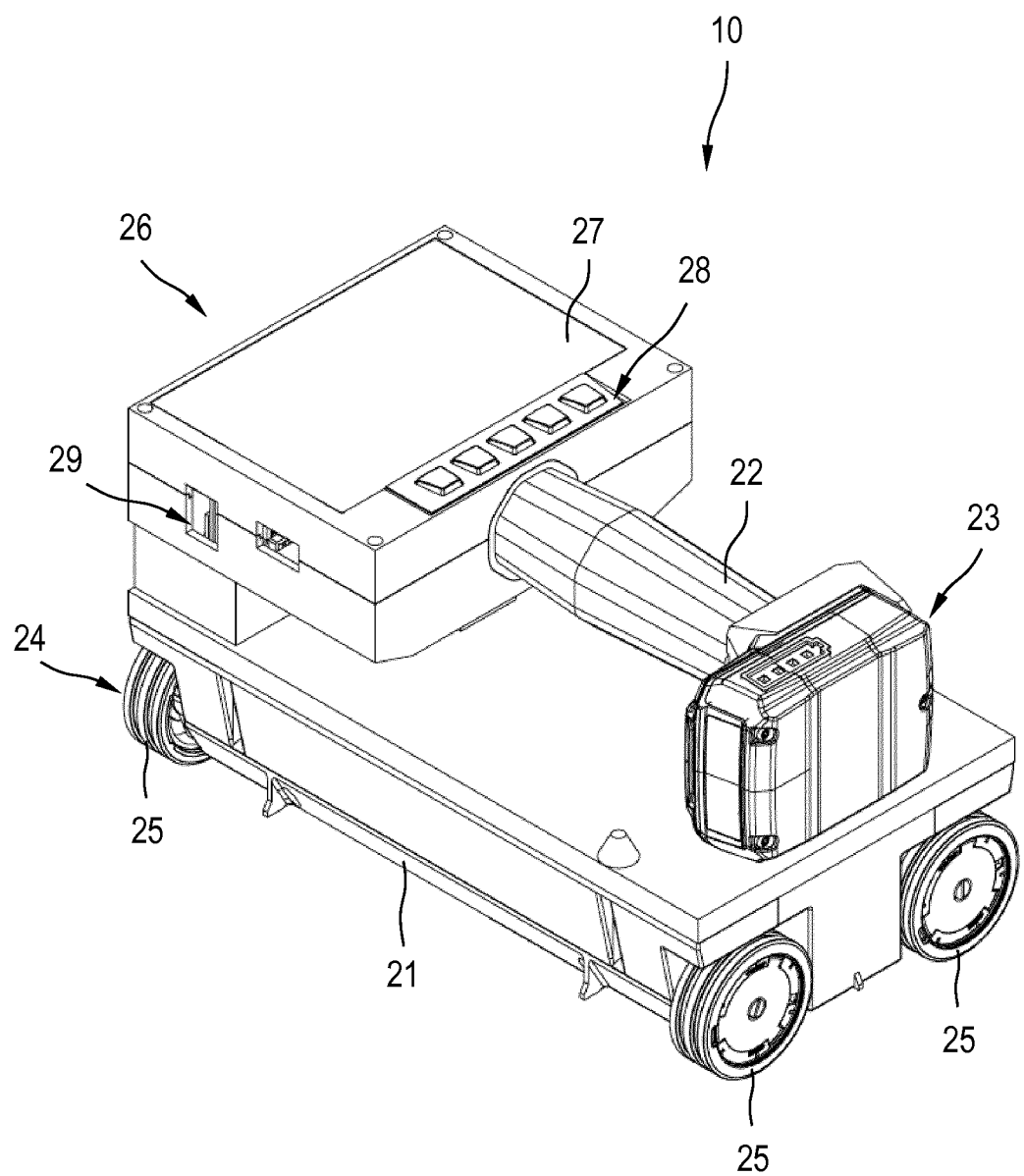
FIGS. 2A, B show the device according to the present invention of FIG. 1 in a three-dimensional representation (FIG. 2A) and the essential components of the device, which include a housing, a solenoid unit, a metal sheet, control and evaluation units, and a display unit including a display, in an exploded view (FIG. 2B)
Figure 2B:
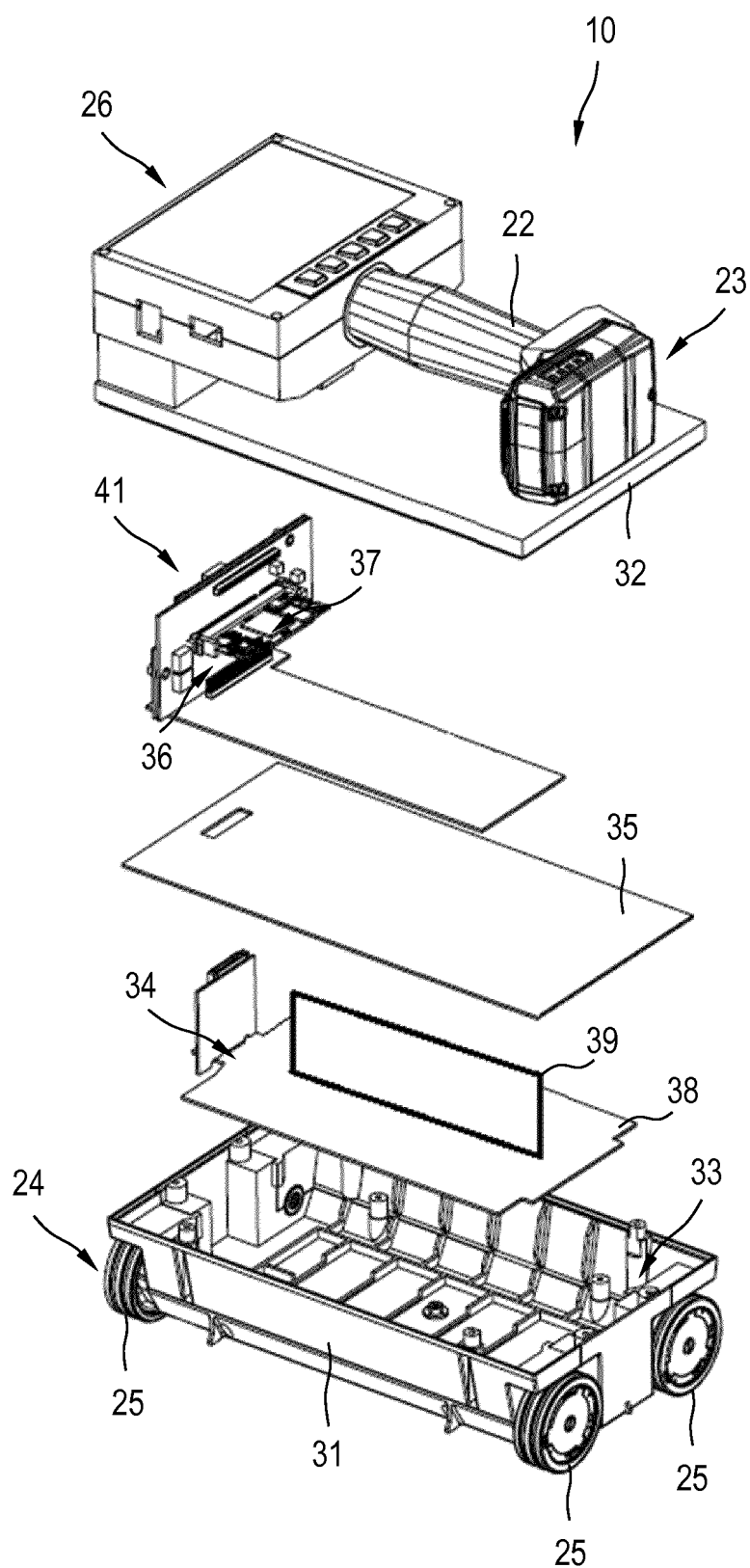

FIGS. 2A, B show device 10 according to the present invention in a three-dimensional representation (FIG. 2A) and the essential components of device 10 in an exploded view (FIG. 2B).

FIG. 2A shows device 10 in the assembled state. Device 10 includes a housing 21, a handle 22, a battery 23, a moving unit 24 including four wheels 25, a display unit 26 including a display 27, an operating unit 28, and data interfaces 29. The user guides device 10 with the aid of handle 22 and moving unit in feed direction 14 over ground 12 to be detected, which is designed as a ground floor, for example.

FIG. 2B shows the essential components of device 10 according to the present invention in an exploded view. In the exemplary embodiment, device 10 includes five assemblies, which are inserted into one another and assembled. Housing 21 is made up of a lower housing shell 31, which is connected to moving unit 24, and an upper housing cover 32, which is connected to display unit 26. When assembled, housing shell 31 and housing cover 32 enclose an interior 33, in which a solenoid unit 34, a metal sheet 35, a control unit 36 and an evaluation unit 37 are situated.

Solenoid unit 34 includes a transmitter coil unit 38, which includes one or multiple transmitter coil(s), and a receiver coil unit 39, which includes one or multiple receiver coil(s). The number of the transmitter and receiver coils, the size and shape of the transmitter and receiver coils, and the spatial orientation of the transmitter and receiver coils are usually adapted to electrically conducting objects to be measured 11 to be detected, which are to be measured with the aid of device 10 according to the present invention. The idea of device 10 according to the present invention is independent of the design of transmitter coil unit 38 and of receiver coil unit 39.

Control unit 36 is designed to control transmitter coil unit 38 and receiver coil unit 39 and is circuitry-wise connected to solenoid unit 34. Evaluation unit 37 is designed to evaluate the voltage induced in the receiver coils and is circuitry-wise connected to solenoid unit 34. The term "evaluation unit" covers all components for the signal and measured value processing of the received signals, such as amplifiers, filters or analog-to-digital converters. Control unit 36 and evaluation unit 37 are integrated into a checking unit 41 in the exemplary embodiment.

Metal sheet 35 may have multiple boreholes, which may be designed as blind boreholes or through-boreholes. The boreholes are used, on the one hand, as retaining points for the transmitter and receiver coils of solenoid unit 34 and, on the other hand, as passages for the circuitry-wise connection of solenoid unit 34 to control unit 36 and evaluation unit 37.

Figure 3:
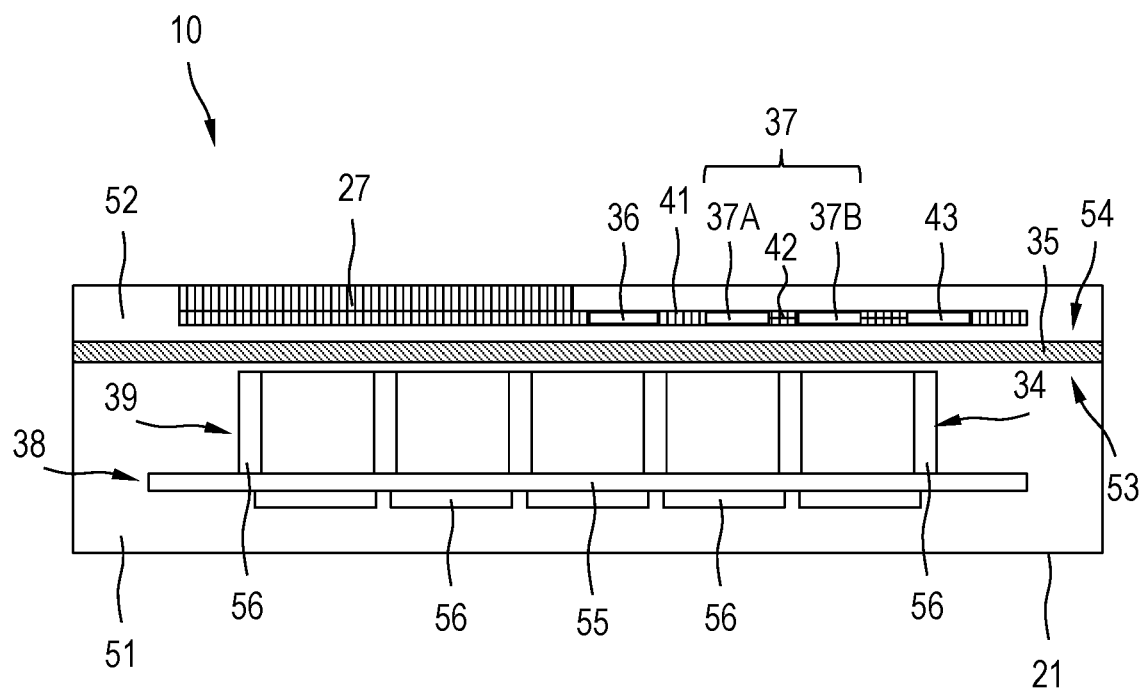
FIG. 3 shows the arrangement of the components of the device according to the present invention in the housing in a schematic representation.

FIG. 3 shows the arrangement of the components of device 10 according to the present invention in housing 21 in a schematic representation. Metal sheet 35 divides interior 33 of housing 21 into a lower portion 51, which faces ground 12 to be detected during the measuring operation of device 10, and an upper portion 52, which faces away from ground 12 to be detected during the measuring operation of device 10. Solenoid unit 34 including transmitter coil unit 38 and receiver coil unit 39 is situated in lower portion 51 of interior 33, and control unit 36 and evaluation unit 37 are situated in upper portion 52 of interior 33.

In principle, it applies with respect to the arrangement of the components of the device that solenoid unit 34 is situated on a lower side 53 of metal sheet 35 facing ground 12. All further components of device 10 which include conducting materials and represent electrically conducting interfering objects are situated on an upper side 54 of metal sheet 35 facing away from ground 12. In addition to control unit 36 and evaluation unit 37, this includes display unit 26 including display 27, operating unit 28, data interfaces 29, and battery 23. Handle 22 is situated above housing cover 32, so that electrically conducting foreign objects, such as a watch, rings or other pieces of jewelry which an operator wears during the measuring operation of device 10, are situated on the far side of upper side 53 of metal sheet 35.

Metal sheet 35 is made of a metal, in principle all metals being suitable. Aluminum, which is designed as pure aluminum or aluminum alloy, and copper, which is designed as pure copper or copper alloy, are particularly suitable metals for metal sheet 35. The term "metal" covers pure metals and metal alloys. The action of metal sheet 35 is dependent on several variables. These include electrical conductivity σ of the metal, magnetic permeability μ of the metal, and sheet metal thickness d of metal sheet 35. Electrical conductivity σ and magnetic permeability μ are established by the selection of a metal, sheet metal thickness d of metal sheet 35 may be varied for an established metal. The decay behavior of the eddy currents in metal sheet 35 may be influenced via the selection of sheet metal thickness d of metal sheet 35.

In the exemplary embodiment, transmitter coil unit 38 includes one transmitter coil 55, and receiver coil unit 39 includes multiple receiver coils 56. As an alternative, transmitter coil unit 38 may include multiple transmitter coils 55 or receiver coil unit 39 may include one receiver coil 56. The number, orientation and/or size of transmitter coils 55 and the number, orientation and/or size of receiver coils 56 are adapted to electrically conducting objects to be measured 11 which are to be measured with the aid of device 10 according to the present invention. The idea of device 10 according to the present invention is independent of the design of transmitter coil unit 38 and of receiver coil unit 39.

A current I flows through transmitter coil 55, which generates a primary magnetic field. Current I is switched off by control unit 36, so that the primary magnetic field decays. When the current is switched off, the primary magnetic field induces eddy currents in electrically conducting objects which generate secondary magnetic fields, the secondary magnetic fields decaying considerably more slowly than the primary magnetic field. The primary magnetic field is superimposed with the secondary magnetic fields of the electrically conducting objects to form a resulting magnetic field.

Metal sheet 35 and the measuring method must be matched to one another in such a way that, during the recording of the measuring signals, on the one hand the undesirable eddy currents generated by electrically conducting foreign and interfering objects have sufficiently decayed and, on the other hand, the desirable currents generated by electrically conducting objects to be measured 11 in ground 12 have not yet excessively decayed.

The evaluation unit 37 comprises a first evaluation unit 37A and a second evaluation unit 37B. The first evaluation unit 37A is connected to the receiver coil unit 39 and is designed to process the measuring signals. The second evaluation unit 37B is connected to the first evaluation unit 37A and is designed to evaluate the processed measuring signals. The first evaluation unit 37A processes the measuring signals, the processed measuring signals are transmitted via a communication link 42 to the second evaluation unit 37B, and the second evaluation unit 37B evaluates the processed measuring signals. The communication link 42 may be designed as a wireless or wired communication link. In the exemplary embodiment, the communication link 42 is designed as a wired communication link. The evaluation unit 37 is connected in a data-transmitting manner to a memory unit 43, in which a calibration signal is stored.

Figure 4:
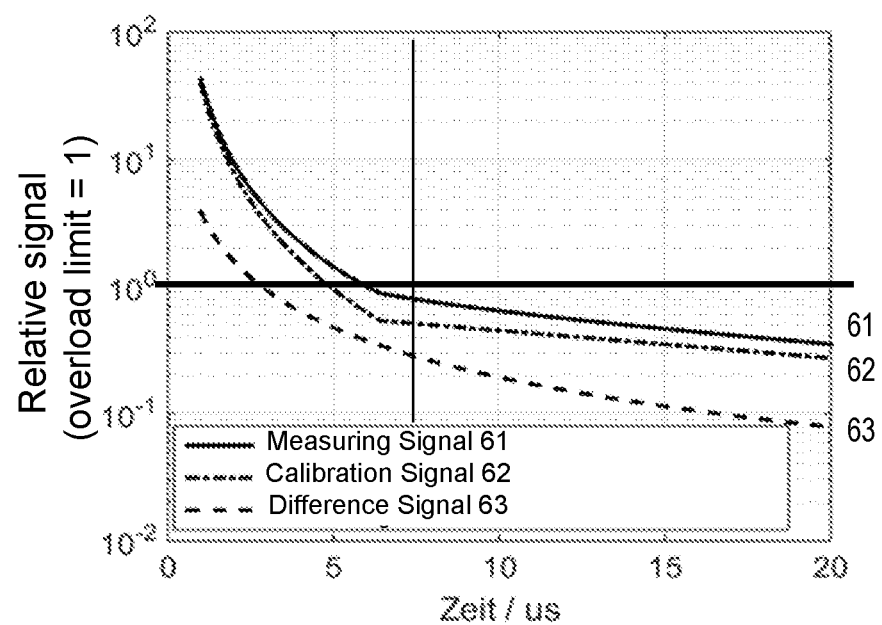
FIG. 4 shows the time curve of a measuring signal, a calibration signal and a difference signal.

FIG. 4 shows the time curve of a measuring signal 61 which was measured with the aid of device 10. To eliminate effects, such as secondary fields of electrically conducting interfering objects, a calibration signal 62 is stored in device 10, which was recorded in the absence of electrically conducting objects to be measured 11 with the aid of device 10. The evaluation is carried out based on a difference signal 63, which is formed by difference creation between measuring signal 61 and calibration signal 62.

Device 10 includes solenoid unit 34 including transmitter coil unit 38 and receiver coil unit 39, control unit 36, and evaluation unit 37 including the first and second evaluation units. During the measuring operation of device 10, a current I flows through transmitter coils 55, and current I is switched off by control unit 36 at a switch-off point in time $t_0$. Voltages are induced in receiver coils 56, which are recorded as received signals by evaluation unit 37. The received signals of receiver coil unit 38 are referred to as calibration signals in the absence of electrically conducting objects to be measured 11, and as measuring signals in the presence of electrically conducting objects to be measured 11.

Evaluation unit 37 of device 10 according to the present invention influences the measuring method insofar as evaluation unit 37 has an overload limit for the received signals. The overload limit is a variable of evaluation unit 37 indicating when an overload of evaluation unit 37 occurs. The overload limit is dependent, for example, on the reference voltage of the analog-to-digital converters of the evaluation unit. Input voltages of the analog-to-digital converters greater than this reference voltage result in an overload. The level of the input voltages depends on the strength of the magnetic field of the eddy currents at the location of the receiver coils, the geometry of the receiver coils, and the used amplification. The received signals of receiver coil unit 39 are standardized to the overload limit. A processing and an evaluation of the received signals is only possible below the overload limit; as long as the amplitudes of the received signals are above the overload limit, evaluation unit 37 is not able to carry out any processing and evaluation of the received signals.

Measuring signal 61 and calibration signal 62 generally have similar time curves. After the current is switched off in transmitter coil unit 38, a rapid drop in the amplitudes of the received signals is observable, which transitions to a slower drop. The rapid drop of the received signals occurs immediately after current I is switched off and describes the penetration of the eddy currents from the surface into the interior of the electrically conducting objects. When the eddy currents flow completely through the electrically conducting objects, the rapid drop transitions into a slower drop of the received signals.

Figure 5A:
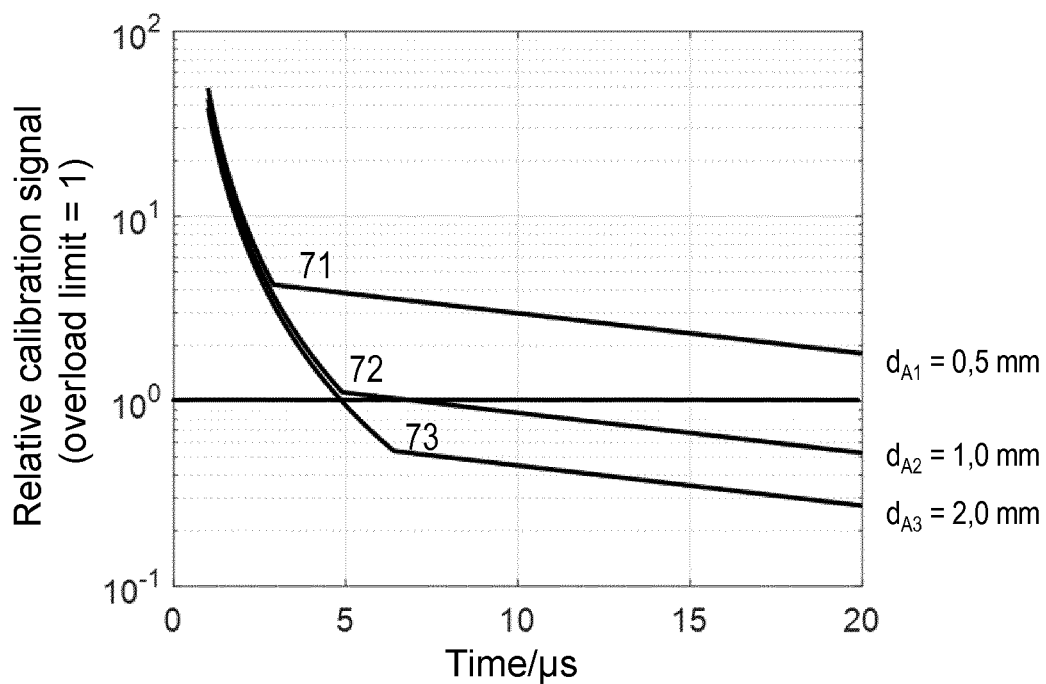
FIGS. 5A, B show the time curves of the standardized calibration signals for three aluminum sheets having different sheet metal thicknesses (FIG. 5A), and the time curves of the standardized calibration signals for three copper sheets having different sheet metal thicknesses (FIG. 5B)
Figure 5B:
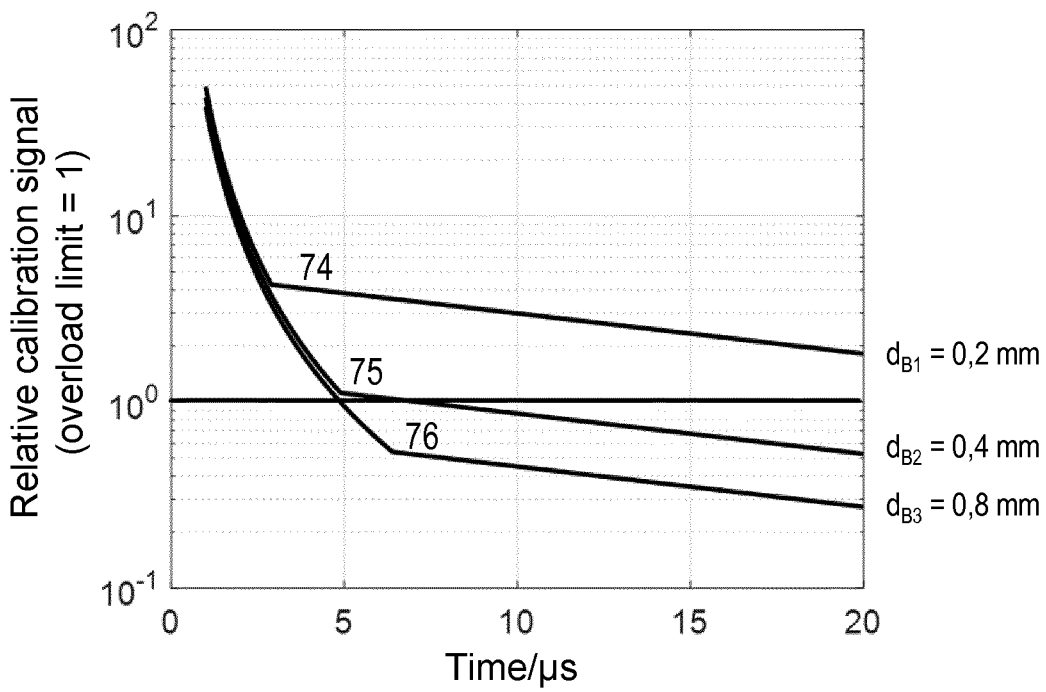

FIGS. 5A, B show the time curves of standardized calibration signals 71, 72, 73, 74, 75, 76 for different metal sheets. FIG. 5A shows the time curves of standardized calibration signals 71, 72, 73 for three metal sheets made up of aluminum, which hereafter are referred to as aluminum sheets, and FIG. 5B shows the time curves of standardized calibration signals 74, 75, 76 for three metal sheets made up of copper, which hereafter are referred to as copper sheets.

The aluminum sheets of FIG. 5A are produced from pure aluminum (content of aluminum greater than 99.5%) having an electrical conductivity $\sigma_A$ of $37 \cdot 10^6$ S/m and a magnetic permeability $\mu_A$ of 1.000022 H/m, and differ from one another in the sheet metal thicknesses. The first aluminum sheet has a first sheet metal thickness $d_{A1}$ of 0.5 mm, the second aluminum sheet $d_{A2}$ has a second sheet metal thickness $d_{A2}$ of 1.0 mm, and the third aluminum sheet has a third sheet metal thickness $d_{A3}$ of 2.0 mm. The copper sheets of FIG. 5B are produced from pure copper (content of copper greater than 99.5%) having an electrical conductivity $\sigma_B$ of $58 \cdot 10^6$ S/m and a magnetic permeability $\mu_B$ of 0.9999936 H/m, and differ from one another in the sheet metal thicknesses. The first copper sheet has a first sheet metal thickness $d_{B1}$ of 0.2 mm, the second copper sheet has a second sheet metal thickness $d_{B2}$ of 0.4 mm, and the third copper sheet has a third sheet metal thickness $d_{B3}$ of 0.8 mm.

The time curves of standardized calibration signals 71 through 76 show that sheet metal thickness d of metal sheet 35 changes the time curves of the calibration signals. The thicker metal sheet 35, the longer it takes for the eddy currents to flow completely through the electrically conducting objects and for the rapid drop to transition into the slower drop. Time shift Δt after the current is switched off in transmitter coil unit 38 is selected in such a way that the rapid drop of the received signal has decayed. At the same time, time shift Δt must not be selected to be too large since the desirable effects of the electrically conducting objects to be measured in the measuring signals decay at increasing time shift Δt.

At approximately 3 μs, calibration signals 71, 74 transition from the rapid drop to the slower drop, the amplitudes considerably exceeding the overload limit during the transition. Since the amplitudes of calibration signals 71, 74 are also above the overload limit for time shifts Δt greater than 20 μs after the current is switched off, the first aluminum sheet and the first copper sheet are not suitable for the used evaluation unit 37 of device 10.

At approximately 5 μs, calibration signals 72, 75 transition from the rapid drop to the slower drop, the amplitudes insignificantly exceeding the overload limit during the transition. To prevent an overload of evaluation unit 37, the maximum amplitudes should not exceed a maximum value. Since the calibration signals are standardized to the overload limit, the maximum value may be indicated as a percentage of the overload limit (0% to 100%). For example, a percentage of 50% of the overload limit is suitable as a maximum value. For calibration signals 72, 75, the amplitudes only drop below the limit of approximately 50% of the overload limit for time shifts Δt greater than 20 μs, so that the second aluminum sheet and the second copper sheet are only conditionally suitable for the used evaluation unit 37. When a percentage of 70% of the overload limit is defined for the maximum value, instead of the percentage of 50% of the overload limit, the amplitudes drop below the maximum value for calibration signals 72, 75 for time shifts Δt greater than 13 μs. The definition of a suitable maximum value depends, among other things, on evaluation unit 37.

At approximately 6 μs, calibration signals 73, 76 transition from the rapid drop to the slower drop, the amplitudes being already below the overload limit during the transition. For the calibration signals, the amplitudes only drop below the limit of approximately 50% of the overload limit for time shifts greater than 7 μs, so that the third aluminum sheet and the third copper sheet are suitable for the used evaluation unit 37. A value of approximately 7 μs is suitable for calibration signals 73, 76 as time shift Δt after the current is switched off in transmitter coil unit 38. When a percentage of 70% of the overload limit is defined for the maximum value, instead of the percentage of 50% of the overload limit, the amplitudes drop below the maximum value for the calibration signals for time shifts Δt greater than 6 μs.

Figure 6:
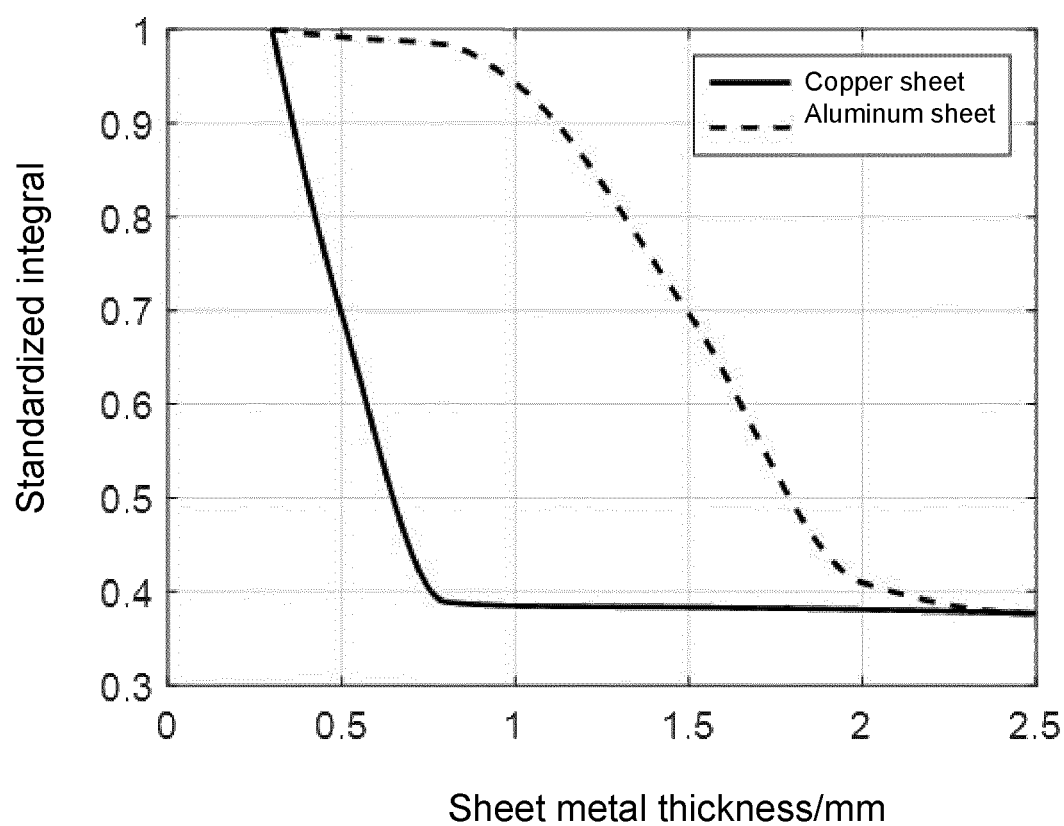
FIG. 6 shows the curve of the integral of the standardized calibration signal of FIGS. 5A, B as a function of sheet metal thickness d of the metal sheet for aluminum sheets and copper sheets.

FIG. 6 shows the standardized curves of the integrated calibration signals from FIGS. 5A, B as a function of sheet metal thickness d of metal sheet 35 for metal sheets made up of aluminum (aluminum sheets) and for metal sheets made up of copper (copper sheets). It should be noted that amplitudes over 1 in FIGS. 5A, B are not measurable due to an overload, and the measured calibration signal has the saturation value 1 in this range. The integrated calibration signals shown in FIG. 6 are also standardized to the overload limit.

The curves of the integrated calibration signals for the used copper sheets show that an overload of evaluation unit 37 occurs for sheet metal thicknesses smaller than 0.35 mm, and favorable measuring conditions exist for sheet metal thicknesses greater than 0.8 mm. With the used aluminum sheets, an overload of evaluation unit 37 occurs for sheet metal thicknesses smaller than 1.0 mm, and favorable measuring conditions exist for sheet metal thicknesses greater than 2.0 mm.

The invention claimed is:

1. A device for detecting electrically conducting objects to be measured in a ground, the device being moved over a surface of the ground during the measuring operation in a measuring orientation, the device comprising:
    a housing;
    a solenoid unit situated in the housing, the solenoid unit including a transmitter coil unit including at least one transmitter coil and including a receiver coil unit including at least one receiver coil;
    a control unit connected to the solenoid unit and designed to control the transmitter coil unit and to control the receiver control unit;
    an evaluation unit connected to the solenoid unit and designed to process and evaluate a voltage induced in the receiver control unit as a measuring signal; and
    a metal sheet in the housing having a sheet metal thickness (d), the metal sheet being situated in parallel to the surface of the ground during the measuring operation, the solenoid unit being situated on a lower side of the metal sheet facing the ground during the measuring operation, and the control unit being situated on an upper side of the metal sheet facing away from the ground during the measuring operation.

2. The device as recited in claim 1 wherein the evaluation unit includes a first evaluation unit processing the measuring signals, and a second evaluation unit evaluating the measuring signals, the first evaluation unit being situated on the upper side of the metal sheet facing away from the ground during the measuring operation.

3. The device as recited in claim 2 wherein the second evaluation unit is situated on the upper side of the metal sheet facing away from the ground during the measuring operation.

4. The device as recited in claim 2 wherein the second evaluation unit is situated outside the housing, the first and second evaluation units being connectable via a communication link.

5. The device as recited in claim 2 wherein the housing encloses an interior, and the metal sheet divides the interior into a lower portion and an upper portion, the solenoid unit being situated in the lower portion, and the control unit and the first evaluation unit being situated in the upper portion.

6. The device as recited in claim 1 wherein the housing encloses an interior, and the metal sheet divides the interior into a lower portion and an upper portion, the solenoid unit being situated in the lower portion, and the control unit being situated in the upper portion.

7. The device as recited in claim 1 further comprising a display unit including a display designed to display a measuring result calculated by the evaluation unit, the display being situated on the upper side of the metal sheet facing away from the ground during the measuring operation.

8. The device as recited in claim 2 further comprising a memory unit connected to the evaluation unit in a data-transmitting manner, a calibration signal being stored in the memory unit, the calibration signal having been ascertained in the absence of electrically conducting objects to be measured.

9. The device as recited in claim 1 wherein the metal sheet is made of aluminum, the metal sheet having a sheet metal thickness (d) of at least 1.0 mm.

10. The device as recited in claim 9 wherein the metal sheet has a sheet metal thickness (d) of at least 2.0 mm.

11. The device as recited in claim 1 wherein the metal sheet is made of copper, the metal sheet having a sheet metal thickness (d) of at least 0.4 mm.

12. The device as recited in claim 11 wherein the metal sheet has a sheet metal thickness (d) of at least 0.8 mm.

13. A method for detecting electrically conducting objects to be measured in a ground using the device as recited in claim 11, the method comprising a step sequence of the following steps:

flowing a current (I) through at least one transmitter coil of the transmitter coil unit;

switching off the current (I) by the control unit at a switch-off point in time ($t_0$);

recording a voltage, induced in the at least one receiver coil of the receiver coil unit, by the evaluation unit with a time shift ($\Delta t$) after the switch-off point in time ($t_0$) of the current (I) as a measuring signal; and determining a difference signal by the evaluation unit as a difference between the measuring signal and a stored calibration signal, the calibration signal having been ascertained in the absence of electrically conducting objects to be measured.

14. The method as recited in claim 3 wherein the time shift ($\Delta t$) is not smaller than 5 μs.

15. The method as recited in claim 3 wherein the time shift ($\Delta t$) is not greater than 10 μs.

16. The device as recited in claim 1 wherein the housing has a lower housing shell and a housing cover enclosing an interior, the metal sheet being in the interior.

17. The device as recited in claim 16 wherein the solenoid unit and the control unit are in the interior.

18. The device as recited in claim 17 wherein the evaluation unit is in the interior.

19. The device as recited in claim 16 further comprising a handle situated above the housing cover.

20. The device as recited in claim 1 further comprising wheels connected to the housing.

* * * * *